United States Patent
Komatsu et al.

(10) Patent No.: US 9,473,107 B2
(45) Date of Patent: Oct. 18, 2016

(54) MULTIMODE ELASTIC WAVE DEVICE

(71) Applicant: SKYWORKS FILTER SOLUTIONS JAPAN CO., LTD., Kadoma-Shi (JP)

(72) Inventors: Tomoya Komatsu, Osaka-Fu (JP); Joji Fujiwara, Osaka-Fu (JP); Tetsuya Tsurunari, Osaka-Fu (JP); Hiroyuki Nakamura, Osaka-Fu (JP); Kazunori Nishimura, Kyoto-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 187 days.

(21) Appl. No.: 14/112,547

(22) PCT Filed: Feb. 5, 2013

(86) PCT No.: PCT/JP2013/000609
§ 371 (c)(1),
(2) Date: Oct. 18, 2013

(87) PCT Pub. No.: WO2013/121734
PCT Pub. Date: Aug. 22, 2013

(65) Prior Publication Data
US 2014/0049341 A1    Feb. 20, 2014

(30) Foreign Application Priority Data
Feb. 15, 2012 (JP) .................... 2012-030274

(51) Int. Cl.
*H03H 9/54* (2006.01)
*H03H 9/05* (2006.01)
(Continued)

(52) U.S. Cl.
CPC ............... *H03H 9/54* (2013.01); *H03H 9/008* (2013.01); *H03H 9/0566* (2013.01); *H03H 9/14582* (2013.01); *H03H 9/14588* (2013.01); *H03H 9/6436* (2013.01); *H03H 9/0576* (2013.01)

(58) Field of Classification Search
CPC .. H03H 9/008; H03H 9/0566; H03H 9/0576; H03H 9/14588; H03H 9/6436; H03H 9/14582
USPC .......................................... 333/193–196, 187
See application file for complete search history.

(56) References Cited

U.S. PATENT DOCUMENTS 7,847,657 B2    12/2010   Takahashi et al.
8,436,696 B2 *  5/2013   Nakai ................. H03H 9/0038
                                                    310/313 D
(Continued)

FOREIGN PATENT DOCUMENTS

JP    2001-332954    11/2001
JP    2003-258595     9/2003
(Continued)

OTHER PUBLICATIONS

Japanese version of International Search Report of PCT Application No. PCT/JP2013/000609 dated Apr. 16, 2013.

*Primary Examiner* — Dinh T Le
(74) *Attorney, Agent, or Firm* — Lando & Anastasi, LLP (57) ABSTRACT

A multimode elastic wave device includes a pair of reflectors, and a first interdigital transducer (IDT) electrode through a fifth IDT electrode arranged between the pair of reflectors. In this configuration, each of the average of electrode-finger pitches in the first IDT electrode and the average of electrode-finger pitches in the fifth IDT electrode is smaller than both of the average of electrode-finger pitches in the second IDT electrode and the average of electrode-finger pitches in the fourth IDT electrode.

17 Claims, 7 Drawing Sheets

(51) Int. Cl.
  *H03H 9/145* (2006.01)
  *H03H 9/64* (2006.01)
  *H03H 9/00* (2006.01)

(56) References Cited

U.S. PATENT DOCUMENTS

| | | | |
|---|---|---|---|
| 8,803,625 B2* | 8/2014 | Yamanaka | H03H 9/02551 310/313 A |
| 2004/0095207 A1* | 5/2004 | Nakamura | H03H 9/0061 333/133 |
| 2005/0035831 A1 | 2/2005 | Kawachi et al. | |
| 2010/0259341 A1 | 10/2010 | Nakai | |
| 2011/0043075 A1 | 2/2011 | Okumichi et al. | |
| 2012/0146746 A1 | 6/2012 | Shimozono | |

FOREIGN PATENT DOCUMENTS

| | | |
|---|---|---|
| JP | 2008-035092 | 2/2008 |
| WO | 2009-001651 | 12/2008 |
| WO | 2009-131227 | 10/2009 |
| WO | 2011-024876 | 3/2011 |

\* cited by examiner

MULTIMODE ELASTIC WAVE DEVICE

CROSS-REFERENCE TO RELATED APPLICATIONS

The present application is a national stage application of the PCT international application No. PCT/JP2013/000609 filed on Feb. 5, 2013 and claims the benefit of foreign priority of Japanese Patent Application No. 2012-030274 filed on Feb. 15, 2012, the contents of which are incorporated herein by reference.

TECHNICAL FIELD

The present invention relates to a multimode elastic wave device, which is mainly for use in a mobile communication device, for example.

BACKGROUND ART

Recent technical advances have remarkably reduced the size and weight of communication devices, such as a mobile phone. Examples of a filter for use in such a communication device include elastic wave devices, such as a surface acoustic wave device and an elastic boundary wave device that can be downsized. In mobile communication systems, the number of simultaneous transmission and reception systems, such as code division multiple access (CDMA), is rapidly increasing, which rapidly increases the demand for duplexers. Further, in recent years, a large number of duplexers whose reception ends perform balanced operation have been used.

Under these circumstances, a multimode elastic wave device that has an unbalanced-balanced conversion function is used as the filter on the reception side of a duplexer. Further, a change in the mobile communication system makes requirement specifications for duplexers stricter. This creates a need for a multimode elastic wave device that has a broader passband with a steeper attenuation characteristic closer to a square shape than conventional ones.

As conventional arts of the present invention, techniques disclosed in Patent Literature 1 through Patent Literature 3, for example, are known. Patent Literature 1 discloses a technique for changing the periods of the reflector electrodes, according to patterns, in a multimode elastic wave device that includes three interdigital transducer (IDT) electrodes. This technique aims to suppress spuriousness and provide high steepness at the same time.

Patent Literature 2 discloses a technique for using a plurality of reflector groups having different periods as reflectors in a multimode elastic wave device that includes three IDT electrodes. This technique aims to suppress spuriousness in proximity to the passband and provide an excellent attenuation characteristic.

Patent Literature 3 discloses a technique for devising narrow-pitch parts in the boundaries between IDT electrodes in a multimode elastic wave device that includes five IDT electrodes. This technique aims to enhance steepness in proximity to the passband. Suppose that the narrow-pitch parts in the boundaries between the IDT electrodes are a first narrow-pitch part through a fourth narrow-pitch part in order. The electrode-finger pitch in the first narrow-pitch part is smaller than the electrode-finger pitch in the second narrow-pitch part, and the electrode-finger pitch in the fourth narrow-pitch part is smaller than the electrode-finger pitch in the third narrow-pitch part. This configuration controls the displacement distribution in which elastic waves are exited.

CITATION LIST

Patent Literature

PTL1 Japanese Patent Unexamined Publication No. 2003-258595
PTL2 Japanese Patent Unexamined Publication No. 2001-332954
PTL2 International Publication No. WO/2009/001651

SUMMARY OF THE INVENTION

The present invention provides a multimode elastic wave device that has a steeper attenuation characteristic closer to a square shape.

A multimode elastic wave device in accordance with a first aspect of the present invention includes the following elements:
  a piezoelectric substrate;
  a first reflector and a second reflector; and
  a first interdigital transducer (IDT) electrode, a second IDT electrode, a third IDT electrode, a fourth IDT electrode, and a fifth IDT electrode. The first reflector, the second reflector, and the first IDT electrode through the fifth IDT electrode are disposed on the piezoelectric substrate. The first IDT electrode through the fifth IDT electrode are arranged, between the first reflector and the second reflector, along the propagation direction of elastic waves in order from the side close to the first reflector. Each of the average of electrode-finger pitches in the first IDT electrode and the average of electrode-finger pitches in the fifth IDT electrode is smaller than both of the average of electrode-finger pitches in the second IDT electrode and the average of electrode-finger pitches in the fourth IDT electrode.

A multimode elastic wave device in accordance with a second aspect of the present invention includes the following elements:
  a piezoelectric substrate;
  a first reflector and a second reflector; and
  a first interdigital transducer (IDT) electrode, a second IDT electrode, a third IDT electrode, a fourth IDT electrode, and a fifth IDT electrode. The first reflector, the second reflector, and the first IDT electrode through the fifth IDT electrode are disposed on the piezoelectric substrate. The first IDT electrode through the fifth IDT electrode are arranged, between the first reflector and the second reflector, along the propagation direction of elastic waves in order from the side close to the first reflector. Each of the first IDT electrode through the fifth IDT electrode has a constant-pitch region where the electrode-finger pitches of the IDT electrode are substantially equal. Each of the electrode-finger pitch in the constant-pitch region of the first IDT electrode, the electrode-finger pitch in the constant-pitch region of the third IDT electrode, and the electrode-finger pitch in the constant-pitch region of the fifth IDT electrode is smaller than both of the electrode-finger pitch in the constant-pitch region of the second IDT electrode and the electrode-finger pitch in the constant-pitch region of the fourth IDT electrode.

With each of these configurations, the displacement distribution of the standing waves of the elastic waves can be concentrated in the sides closer to reflectors than the positions of the second IDT electrode and the fourth IDT electrode. As a result, the characteristics are affected by the reflectors. Therefore, using the reflectors, the multimode elastic wave device can suppress resonance in high-order longitudinal modes at frequencies in proximity to the low-frequency side of the passband. Thereby, a steep attenuation characteristic can be obtained.

DESCRIPTION OF EMBODIMENT

Exemplary Embodiment

Prior to the description of the exemplary embodiment of the present invention, problems in the conventional configurations are described. In a multimode elastic wave device of the five-electrode type that includes five IDT electrodes, the passband of the filter is formed by combination of a zero-order resonant mode and a so-called IDT-IDT resonant mode in which the displacement distribution is concentrated in the boundary of two adjacent IDT electrodes. At the same time, resonance in high-order longitudinal modes, such as a second-order mode and a four-order mode, are present at low frequencies in proximity to the passband. This makes it difficult to provide steepness at low frequencies in the passband of the filter. In order to obtain a filter that has a characteristic of high steepness at low frequencies in the passband, resonance in these high-order longitudinal modes needs to be weakened sufficiently so as not to combine with the zero-mode resonance.

Figure 1:
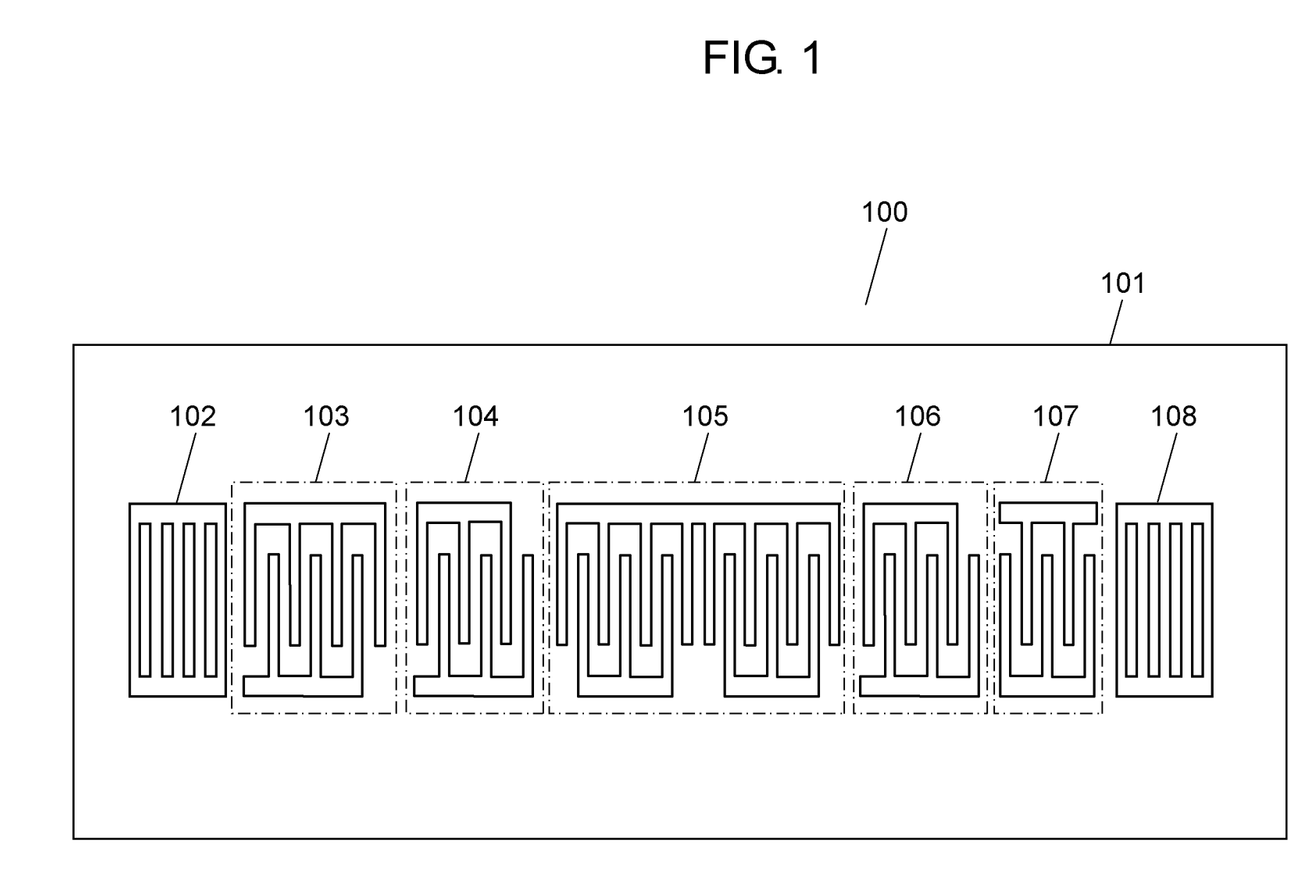
FIG. 1 is a top schematic diagram of a multimode elastic wave device in accordance with an exemplary embodiment of the present invention.

Hereinafter, a description is provided for an elastic wave device in accordance with the exemplary embodiment of the present invention with reference to the accompanying drawings. FIG. 1 is a diagram showing a configuration of multimode elastic wave device 100 in accordance with the exemplary embodiment. An example of the multimode elastic wave device is a double-mode surface acoustic wave (SAW) device. The multimode elastic wave device is an elastic wave device that provides desired bandpass characteristics by exciting elastic waves in a plurality of modes.

Multimode elastic wave device 100 includes the following elements: piezoelectric substrate 101; first reflector 102 and second reflector 108 (hereinafter, being referred to as reflectors 102 and 108); and first interdigital transducer (IDT) electrode 103, second IDT electrode 104, third IDT electrode 105, fourth IDT electrode 106, and fifth IDT electrode 107 (hereinafter, IDT electrodes 103 through 107). Reflectors 102 and 108, and IDT electrode 103 through 107 are disposed on piezoelectric substrate 101. IDT electrode 103 through IDT electrode 107 are arranged, between reflector 102 and reflector 108, along the propagation direction of elastic waves in order from the side close to reflector 102. That is, IDT electrode 103 is closest to reflector 102, and IDT electrode 107 is closest to reflector 108.

Piezoelectric substrate 101 is made from lithium tantalate or lithium niobate, for example. Each of IDT electrodes 103 through 107 is formed of a pair of comb electrodes (interdigital transducer electrodes). Each of reflectors 102 and 108 and IDT electrodes 103 through 107 is made from a single metal substance, such as aluminum, copper, silver, gold, titanium, tungsten, molybdenum, platinum and chromium, or an alloy predominantly composed of these metals. Alternatively, a lamination of these metals and alloys is used. With these configurations, multimode elastic wave device 100 excites surface acoustic waves, e.g. shear horizontal (SH) waves and Rayleigh waves, as major waves. FIG. 1 schematically shows reflectors 102 and 108 and IDT electrodes 103 through 107. The numbers of comb electrodes are not limited to those shown in FIG. 1.

Figure 2A:
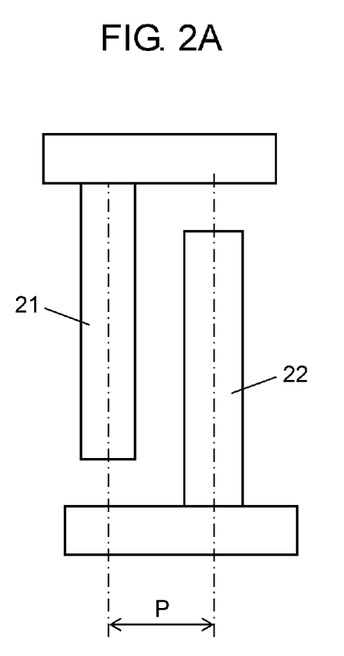
FIG. 2A is a diagram for explaining a definition of an electrode-finger pitch in the multimode elastic wave device of FIG. 1.
Figure 2B:
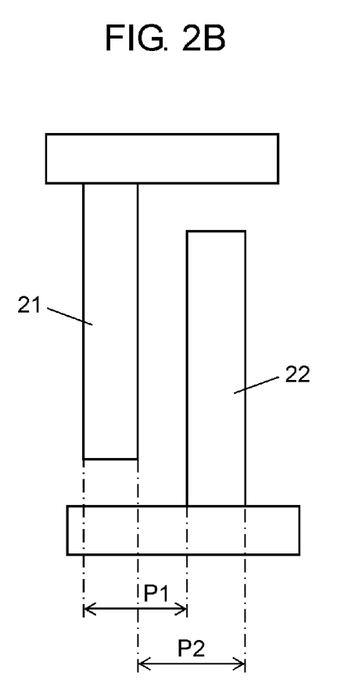
FIG. 2B is a diagram for explaining the definition of the electrode-finger pitch in the multimode elastic wave device of FIG. 1.

As shown in FIG. 2A, electrode-finger pitch P is defined by the center-to-center distance between electrode fingers 21 and 22 adjacent to each other in the propagation direction of elastic waves. In actual measurement, as shown in FIG. 2B, electrode-finger pitch P can be obtained by weighted average $P=(P1+P2)/2$ where P1 is the distance between the end of one side of electrode 21 and the end of one side of adjacent electrode 22 and P2 is the distance between the ends of the other sides thereof.

Reflector 102 is formed of 74 electrode fingers, for example. The average of electrode-finger pitches defined by the center-to-center distances between the electrode fingers is 2.055 μm. Reflector 108 is also formed of 74 electrode fingers and the average of electrode-finger pitches is 2.055 μm. The average of electrode-finger pitches is obtained by dividing the sum of the dimensions of electrode-finger pitches by (the number of electrode fingers−1).

IDT electrode 103 is formed of 35 electrode fingers (17.5 pairs) and the average of electrode-finger pitches is 1.936 μm. IDT electrode 104 is formed of 35 electrode fingers (17.5 pairs) and the average of electrode-finger pitches is 2.005 μm. IDT electrode 105 is formed of 58 electrode fingers (29 pairs) and the average of electrode-finger pitches is 1.946 μm. IDT electrode 106 is formed of 35 electrode fingers (17.5 pairs) and the average of electrode-finger pitches is 2.005 μm. IDT electrode 107 is formed of 35 electrode fingers (17.5 pairs) and the average of electrode-finger pitches is 1.936 μm. IDT electrode 105 is divided into two regions at the center of the propagation direction. The comb electrodes are disposed such that these two regions are 180° out of phase with each other.

As described above, each of the average of the electrode-finger pitches in IDT electrode 103 and the average of the electrode-finger pitches in IDT electrode 107 is smaller than both of the average of the electrode-finger pitches in IDT electrode 104 and the average of the electrode-finger pitches in IDT electrode 106. With this configuration, the displacement distribution of the standing waves of the elastic waves can be concentrated in the positions of IDT electrodes 103 and 107, which are closer to reflectors 102 and 108 than the positions of IDT electrodes 104 and 106, respectively. As a result, the characteristics are affected by reflectors 102 and 108. With this configuration, using reflectors 102 and 108, multimode elastic wave device 100 can suppress resonance in high-order longitudinal modes at frequencies in proximity to the low-frequency side of the passband, and provides a steep attenuation characteristic. That is, this configuration can provide filter characteristics of suppressing resonance in high-order longitudinal modes and enhancing the steepness in proximity to the low-frequency side of the passband.

Preferably, the average of the electrode-finger pitches in IDT electrode 105 is smaller than both of the average of the electrode-finger pitches in IDT electrode 104 and the average of the electrode-finger pitches in IDT electrode 106. With this configuration, the displacement distribution of the standing waves of the elastic waves can be concentrated in the position of IDT electrode 105, which is closer to the center than the positions of IDT electrodes 104 and 106. This configuration can reduce the insertion loss on the high-frequency side of the passband.

Therefore, preferably, each of the average of the electrode-finger pitches in IDT electrode 103, the average of the electrode-finger pitches in IDT electrode 105, and the average of the electrode-finger pitches in IDT electrode 107 is smaller than both of the average of the electrode-finger pitches in IDT electrode 104 and the average of the electrode-finger pitches in IDT electrode 106. With this configuration, the displacement distribution of the standing waves can be concentrated in the sides closer to reflectors 102 and 108. Thus, a filter can be fabricated with reflectors 102 and 108 so as to have a steep characteristic on the low-frequency side of the passband without increasing the insertion loss. More preferably, each of the average of the electrode-finger pitches in IDT electrode 103, and the average of the electrode-finger pitches in IDT electrode 107 is smaller than the average of the electrode-finger pitches in IDT electrode 105. This configuration makes the characteristics more susceptible to reflectors 102 and 108, thus more advantageously providing filter characteristics of an excellent attenuation characteristic close to a square shape. That is, a steep characteristic is easily obtained.

Preferably, ratio Pr1/Pi2 ranges from 1.02 to 1.035 inclusive. Here, Pr1 is the average of the electrode-finger pitches in reflector 102 and Pi2 is the average of the electrode-finger pitches in IDT electrode 104. Similarly, ratio Pr2/Pi4 ranges from 1.02 to 1.035 inclusive. Here, Pr2 is the average of the electrode-finger pitches in reflector 108 and Pi4 is the average of the electrode-finger pitches in IDT electrode 106. If one of Pr1/Pi2 and Pr2/Pi4 is less than 1.02, the insertion loss of the filter increases on the low-frequency side of the passband. If one of Pr1/Pi2 and Pr2/Pi4 is greater than 1.035, suppression of resonance in high-order longitudinal modes is insufficient and thus the steepness in proximity to the low-frequency side of the passband decreases.

Figure 3:
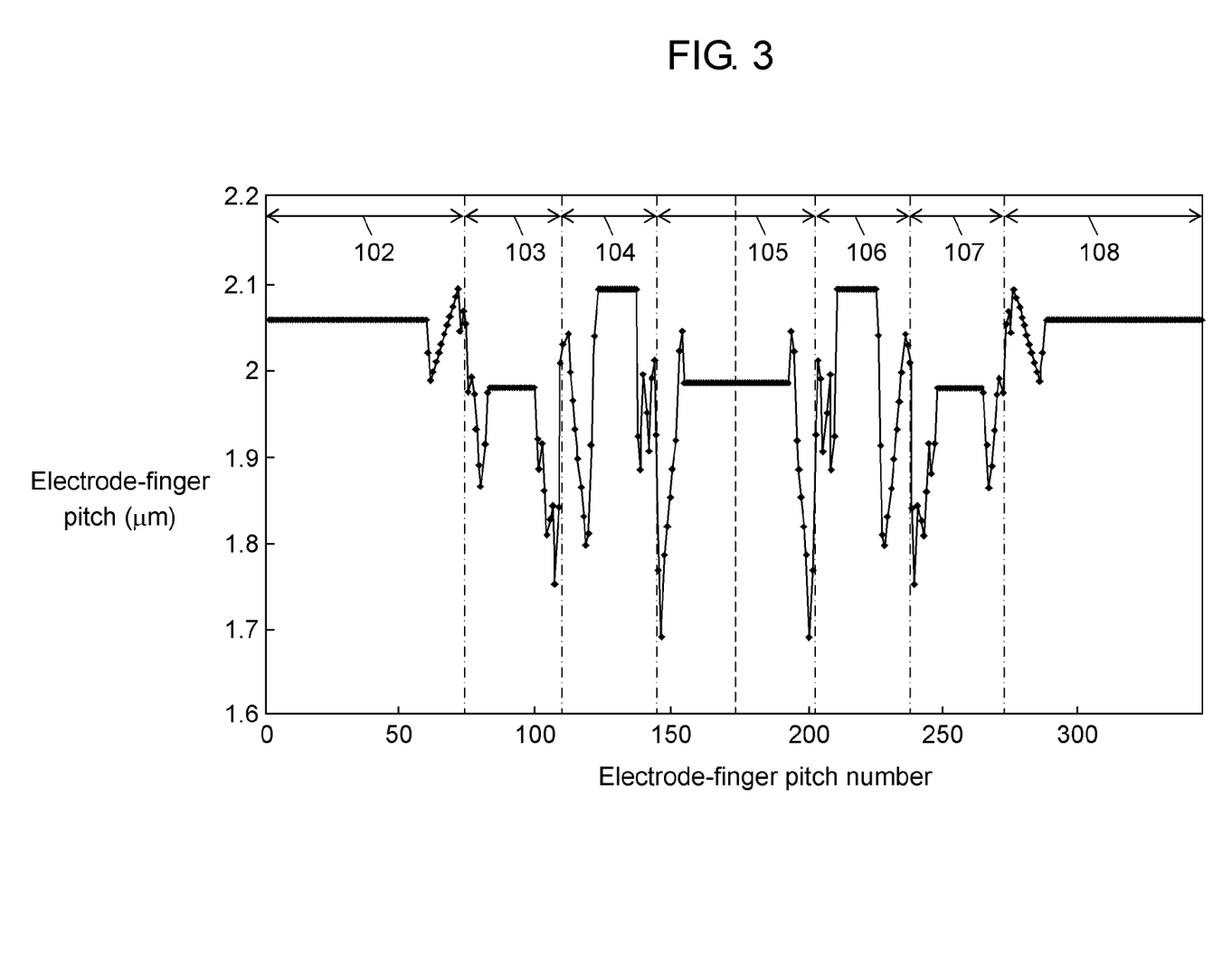
FIG. 3 is a diagram for explaining electrode-finger pitches in the multimode elastic wave device of FIG. 1.

FIG. 3 is a diagram for detailing a configuration of the electrode-finger pitches in multimode elastic wave device 100. That is, FIG. 3 details how the electrode-finger pitches are in each region.

The horizontal axis of FIG. 3 shows numbers given to the spaces between the electrode fingers. Here, the number that indicates the space (hereinafter, an electrode-finger pitch number) between the electrode finger at the left end and the right adjacent one in reflector 102 disposed on the left side in FIG. 1 is set to 1, and a number is given to each of the spaces in order from the left to the right. The vertical axis of FIG. 3 shows the electrode-finger pitches (in μm) corresponding to the numbers sequentially given to the spaces between the electrode fingers in reflector 102, IDT electrode 103, IDT electrode 104, IDT electrode 105, IDT electrode 106, IDT electrode 107, and reflector 108. Each of the alternate long and short dash lines in FIG. 3 shows the boundary between a reflector and an IDT electrode, or the boundary between IDT electrodes. For convenience, each separate range with a reference mark shows the position of a reflector or an IDT electrode.

As obvious from FIG. 3, the electrode-finger pitches are set so as to have a maximum value of 2.095 μm and a minimum value of 1.987 μm in the region relatively close to IDT electrode 103 in reflector 102, and in the region relatively close to IDT electrode 107 in reflector 108. In the region relatively far from IDT electrode 103 or IDT electrode 107, the electrode-finger pitches are set substantially constant at 2.058 μm.

As described above, each of the average of the electrode-finger pitches in IDT electrode 103, the average of the electrode-finger pitches in IDT electrode 105, and the average of the electrode-finger pitches in IDT electrode 107 is smaller than both of the average of the electrode-finger pitches in IDT electrode 104 and the average of the electrode-finger pitches in IDT electrode 106. In this configuration, the following setting is preferable. In reflector 102, the rate of change in the pitches between adjacent electrode fingers in the region relatively close to IDT electrode 103 is higher than that in the region relatively far from IDT electrode 103. In reflector 108, the rate of change in the pitches between adjacent electrode fingers in the region relatively close to IDT electrode 107 is higher than that in the region relatively far from IDT electrode 107. This setting can suppress resonance in high-order longitudinal modes, thus providing filter characteristics of high steepness on the low-frequency side of the passband.

In order to change the rate of change in the electrode-finger pitches, each of reflectors 102 and 108 may be divided into three or more regions such that electrode fingers are disposed at an equal pitch in each region but the averages of the electrode-finger pitches are different in the respective regions. That is, preferably, each of reflectors 102 and 108 has at least three types of electrode-finger pitches.

As shown in FIG. 3, each of IDT electrode 103 through IDT electrode 107 has a region where the electrode-finger pitches are substantially equal. That is, in the region (constant-pitch region), the electrode-finger pitches are substantially constant. The dimensions of the electrode-finger pitches in the constant-pitch regions are 1.980 μm in IDT electrode 103, 2.094 μm in IDT electrode 104, 1.985 μm in IDT electrode 105, 2.094 μm in IDT electrode 106, and 1.980 μm in IDT electrode 107.

That is, each of the electrode-finger pitch in the constant-pitch region of IDT electrode 103, the electrode-finger pitch in the constant-pitch region of IDT electrode 105, and the electrode-finger pitch in the constant-pitch region of IDT electrode 107 is smaller than both of the electrode-finger pitch in the constant-pitch region of IDT electrode 104 and the electrode-finger pitch in the constant-pitch region of IDT electrode 106. Also with this configuration, the displacement distribution of the standing waves can be concentrated in the sides closer to reflectors 102 and 108. Thus, this configuration contributes to filter characteristics in which the use of reflectors 102 and 108 provide steepness on the low-frequency side of the passband without increasing the insertion loss. Therefore, other than the magnitude relation between the averages of the electrode-finger pitches in the IDT electrodes described above, the magnitude relation between the electrode-finger pitches in the constant-pitch regions may be set.

Further, it is preferable that each of the electrode-finger pitch in the constant-pitch region of IDT electrode 104 and the electrode-finger pitch in the constant-pitch region of IDT electrode 106 is larger than both of the electrode-finger pitch in the constant-pitch region of reflector 102 and the electrode-finger pitch in the constant-pitch region of reflector 108. This configuration can reduce the amount of attenuation on the low-frequency side of the passband.

Each electrode-finger pitch of the comb electrodes adjacent in the boundary between two adjacent IDT electrodes is plotted on the corresponding long and short dash line in FIG. 3. Specifically, the pitches are set as follows. The electrode-finger pitch of the comb electrodes adjacent in the boundary between IDT electrode 103 and IDT electrode 104 is 2.030 µm. The electrode-finger pitch of the comb electrodes adjacent in the boundary between IDT electrode 104 and IDT electrode 105 is 1.924 µm. The electrode-finger pitch of the comb electrodes adjacent in the boundary between IDT electrode 105 and IDT electrode 106 is 1.924 µm. The electrode-finger pitch of the comb electrodes adjacent in the boundary between IDT electrode 106 and IDT electrode 107 is 2.030 µm. The minimum of the electrode-finger pitches in IDT electrode 103 is 1.752 µm. The minimum of the electrode-finger pitches in IDT electrode 104 is 1.796 µm. The minimum of the electrode-finger pitches in IDT electrode 105 is 1.690 µm. The minimum of the electrode finger-pitches in IDT electrode 106 is 1.796 µm. The minimum of the electrode-finger pitches in IDT electrode 107 is 1.752 µm.

In this manner, it is preferable that the electrode-finger pitch of the comb electrodes adjacent in the boundary between two adjacent IDT electrodes is larger than of the minimum of the electrode-finger pitches in each of IDT electrode 103 through IDT electrode 107. This configuration can enhance the power durability. This advantage is considered to be obtained by alleviating the concentration of the displacement distribution in the electrode fingers adjacent in the boundary of two adjacent IDT electrodes that are most likely to be damaged in multimode elastic wave device 100.

Figure 4A:
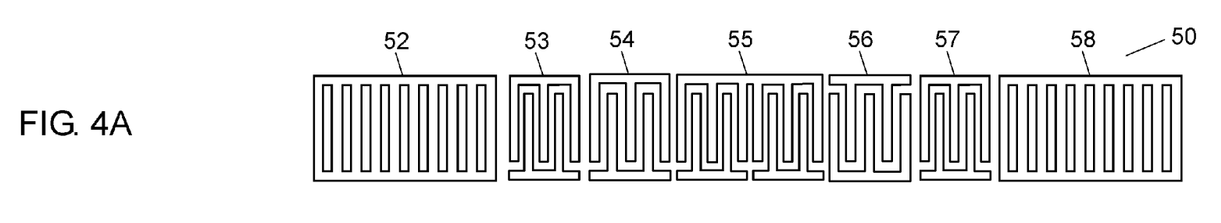
FIG. 4A is a top schematic diagram of a multimode elastic wave device in accordance with a comparative example.
Figure 4B:
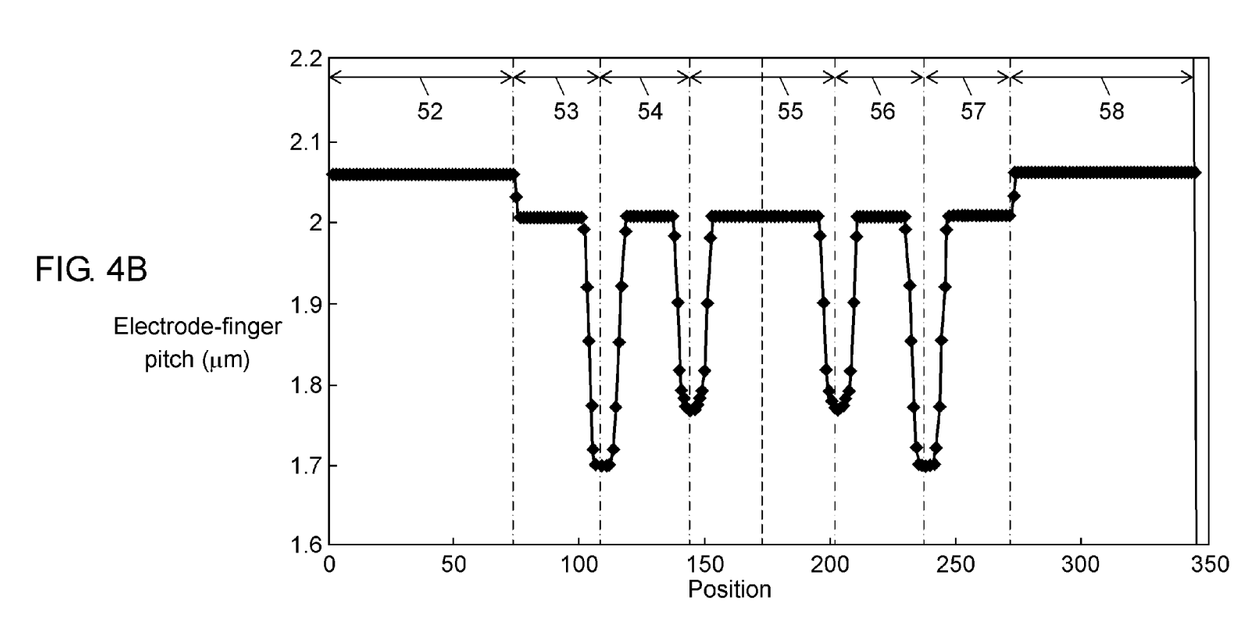
FIG. 4B is a diagram for explaining electrode-finger pitches in the multimode elastic wave device of FIG. 4A.
Figure 5:
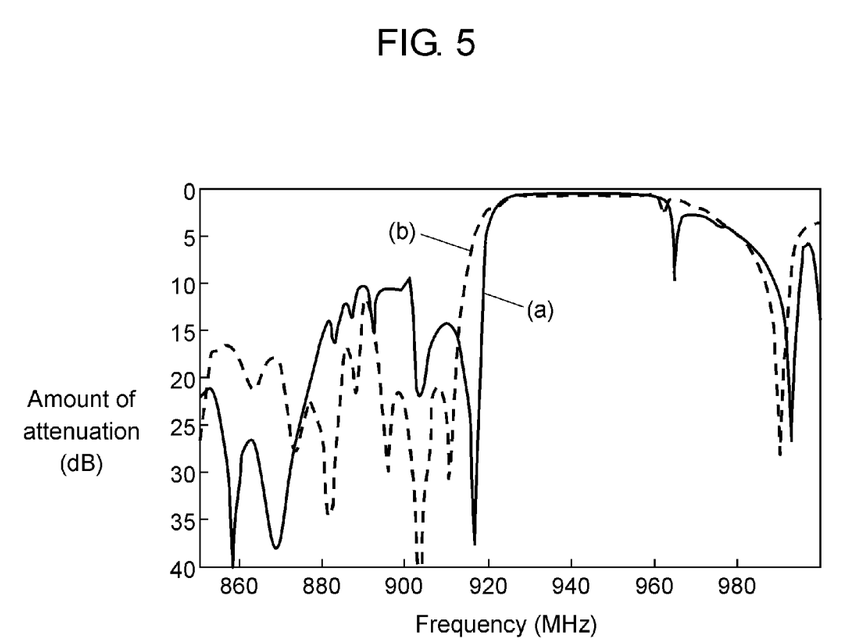
FIG. 5 is a graph for comparing characteristics between the multimode elastic wave device of FIG. 3 and the multimode elastic wave device of FIG. 4B.

Next, the advantage of the above configuration is described. As a comparative example, the characteristics of multimode elastic wave device 50 of the five-electrode type having a configuration of FIG. 4A and FIG. 4B are shown. Further, the filter characteristics of multimode elastic wave device 100 are shown in FIG. 5. FIG. 4A is a top schematic diagram of multimode elastic wave device 50, in which the illustration of a piezoelectric substrate is omitted. FIG. 4B is a diagram for explaining electrode-finger pitches in multimode elastic wave device 50.

The electrode-finger pitch in each of reflectors 52 and 58 is constant at 2.058 µm. The average of electrode-finger pitches in first IDT electrode 53 is 1.958 µm. The average of electrode-finger pitches in second IDT electrode 54 is 1.921 µm. The average of electrode-finger pitches in third IDT electrode 55 is 1.965 µm. The average of electrode-finger pitches in fourth IDT electrode 56 is 1.921 µm. The average of electrode-finger pitches in fifth IDT electrode 57 is 1.958 µm. That is, each of the average of the electrode-finger pitches in IDT electrode 53 and the average of the electrode-finger pitches in IDT electrode 57 is larger than both of the average of the electrode-finger pitches in IDT electrode 54 and the average of the electrode-finger pitches in IDT electrode 56. The average of the electrode-finger pitches in IDT electrode 55 is larger than both of the average of the electrode-finger pitches in IDT electrode 54 and the average of the electrode-finger pitches in IDT electrode 56.

In FIG. 5, solid curve (a) shows filter characteristics of multimode elastic wave device 100, and broken curve (b) shows filter characteristics of multimode elastic wave device 50. FIG. 5 shows that multimode elastic wave device 100 has a steep attenuation characteristic on the low-frequency side of the passband.

The configuration of multimode elastic wave device 50 is disclosed in Patent Literature 3. Patent Literature 3 discloses that a steep characteristic is obtained at frequencies on the low-frequency side of the passband in the following configuration. That is, each of the minimum pitch of the electrode fingers in the boundary between IDT electrode 53 and IDT electrode 54 and the minimum pitch of the electrode fingers in the boundary between IDT electrode 56 and IDT electrode 57 is smaller than both of the minimum pitch of the electrode fingers in the boundary between IDT electrode 54 and IDT electrode 55 and the minimum pitch of the electrode fingers in the boundary between IDT electrode 55 and IDT electrode 56. However, multimode elastic wave device 100 shows a greater advantage.

In this exemplary embodiment, multimode elastic wave device 100 of the five-electrode type is described as an example of multimode elastic wave devices. The similar advantage can be obtained by application of the above electrode configurations to a multimode elastic wave device of the seven-electrode type, for example, which includes more than five electrodes.

For instance, assume a multimode elastic wave device of the seven-electrode type that includes a first IDT electrode through a seventh IDT electrode arranged, between a first reflector and a second reflector, in order along the propagation direction of elastic waves. The first IDT electrode is adjacent to the first reflector and the seventh IDT electrode is adjacent to the second reflector. In this configuration, each of the average of electrode-finger pitches in the first IDT electrode and the average of electrode-finger pitches in the seventh IDT electrode is set smaller than both of the average of electrode-finger pitches in the second IDT electrode and the average of electrode-finger pitches in the sixth IDT electrode. With this configuration, the displacement distribution of the standing waves of the elastic waves can be concentrated in the positions of the first and seventh IDT electrodes, which are closer to the reflectors than the positions of the second and sixth IDT electrodes, respectively. As a result, the characteristics are affected by the reflectors. With such a configuration, using the reflectors, the multimode elastic wave device of the seven-electrode type can suppress resonance in high-order longitudinal modes at frequencies in proximity to the low-frequency side of the passband, thereby providing a steep attenuation characteristic.

The similar advantage can be obtained when a multimode elastic wave device includes an odd number of IDT electrodes equal to or greater than seven. That is, assume a multimode elastic wave device that includes a first IDT electrode through an n-th IDT electrode arranged, between a first reflector and a second reflector, in order along the propagation direction of elastic waves. N is an odd number equal to or greater than five. The first IDT electrode is adjacent to the first reflector and the n-th IDT electrode is adjacent to the second reflector. In this configuration, it is only necessary to set each of the average of electrode-finger pitches in the first IDT electrode and the average of electrode-finger pitches in the n-th IDT electrode smaller than both of the average of electrode-finger pitches in the second IDT electrode and the average of electrode-finger pitches in the (n−1)-th IDT electrode.

Figure 6:
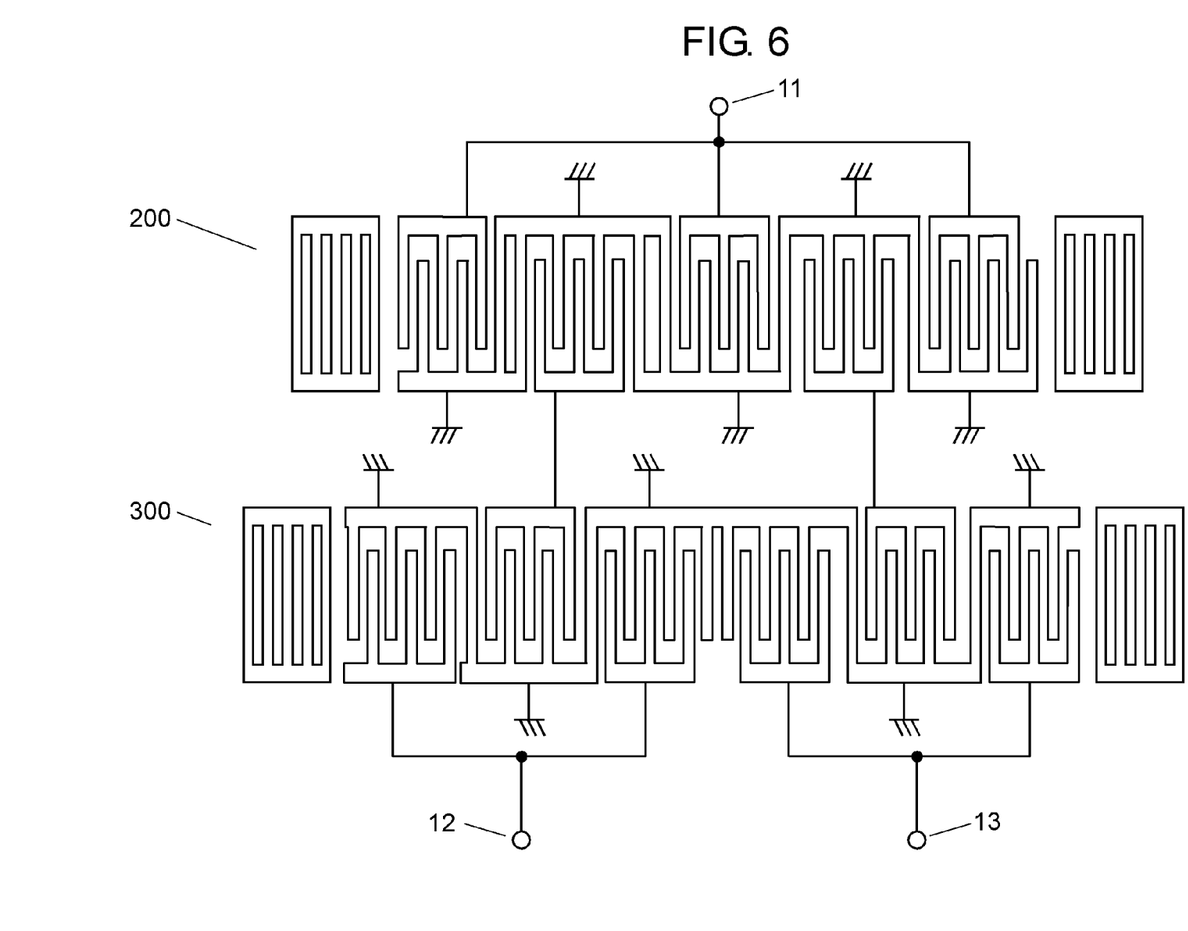
FIG. 6 is a top schematic diagram of still another multimode elastic wave device in accordance with the exemplary embodiment of the present invention.
Figure 7:
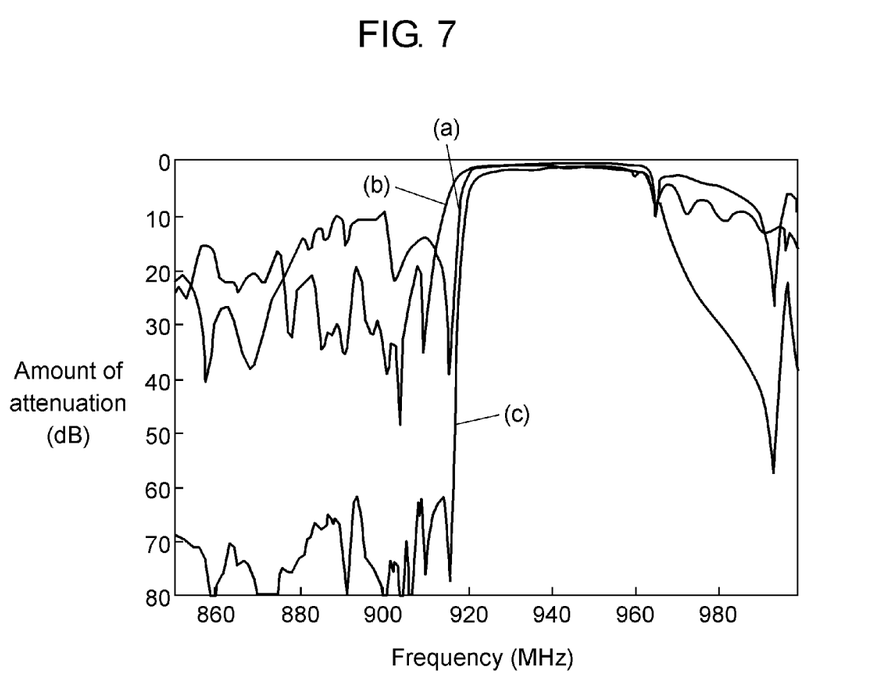
FIG. 7 is a characteristic chart of the multimode elastic wave device of FIG. 6.

Next, with reference to FIG. 6 and FIG. 7, a description is provided for a case where two multimode elastic wave devices including multimode elastic wave device 100 are cascaded with each other. FIG. 6 is a diagram showing a configuration of a cascaded multimode elastic wave device in accordance with the exemplary embodiment. In FIG. 6, the illustration of a piezoelectric substrate is omitted. FIG. 7 shows characteristics of the multimode elastic wave device of FIG. 6.

First multimode elastic wave device 200 of the five-electrode type is cascaded with second multimode elastic wave device 300 of the five-electrode type. First multimode elastic wave device 200 is connected to input terminal 11 and second multimode elastic wave device 300 is connected to output terminals 12 and 13, for balanced operation. One of first multimode elastic wave device 200 and second multimode elastic wave device 300 is the above multimode elastic wave device 100, and the other one is multimode elastic wave device 50, for example.

In FIG. 7, curve (a) has a steep attenuation characteristic on the low-frequency side of the passband. This curve shows a characteristic of multimode elastic wave device 100. Curve (b) shows a characteristic of multimode elastic wave device 50, i.e. an attenuation characteristic with relatively gentle slopes on the low-frequency side of the passband. In this case, preferably, as shown by curve (c), the attenuation poles are set so as to substantially correspond to rebounds (side lobes) in the attenuation characteristic of curve (a).

This setting can provide filter characteristics of a low loss and an excellent attenuation characteristic on the low-frequency side of the passband. That is, whereas the attenuation pole in the vicinity of 917 MHz in curve (a) is approximately 40 dB, the amount of attenuation in the vicinity of 917 MHz is approximately 77 dB in curve (c) that shows the filter characteristics of first multimode elastic wave device 200 and second multimode elastic wave device 300 cascaded with each other.

INDUSTRIAL APPLICABILITY

A multimode elastic wave device in accordance with the present invention has a steeper attenuation characteristic closer to a square shape. Thus, the present invention is useful as a filter having an excellent attenuation characteristic on the low-frequency side of the passband, especially for use as a reception filter of a duplexer.

REFERENCE MARKS IN THE DRAWINGS

11 Input terminal
12, 13 Output terminal
21, 22 Electrode finger
50, 100 Multimode elastic wave device
101 Piezoelectric substrate
52, 102 First reflector (reflector)
58, 108 Second reflector (reflector)
53, 103 First interdigital transducer (IDT) electrode (IDT electrode)
54, 104 Second IDT electrode (IDT electrode)
55, 105 Third IDT electrode (IDT electrode)
56, 106 Fourth IDT electrode (IDT electrode)
57, 107 Fifth IDT electrode (IDT electrode)
200 First multimode elastic wave device
300 Second multimode elastic wave device

The invention claimed is:

1. A multimode elastic wave device comprising:
a piezoelectric substrate;
a first reflector and a second reflector disposed on the piezoelectric substrate; and
a first interdigital transducer (IDT) electrode, a second IDT electrode, a third IDT electrode, a fourth IDT electrode, and a fifth IDT electrode disposed in ordinal order on the piezoelectric substrate between the first reflector and the second reflector along a propagation direction of elastic waves in the multimode elastic wave device, each of the first IDT electrode through the fifth IDT electrode including electrode fingers and having a constant-pitch region in which an electrode-finger pitch of the electrode fingers is substantially equal, a first average of the electrode-finger pitch in the first IDT electrode and a fifth average of the electrode-finger pitch in the fifth IDT electrode both being smaller than both a second average of the electrode-finger pitch in the second IDT electrode and a fourth average of the electrode-finger pitch in the fourth IDT electrode, and a third average of the electrode-finger pitch in the third IDT electrode being smaller than both the second average of the electrode-finger pitch in the second IDT electrode and the fourth average of the electrode-finger pitch in the fourth IDT electrode, such that the multimode elastic wave device suppresses resonance in high order longitudinal modes in frequencies proximate a low frequency side of a passband of the multimode elastic wave device.

2. The multimode elastic wave device of claim 1 wherein within the first reflector, a first rate of change in a pitch of adjacent electrode fingers in a first region close to the first IDT electrode is higher than a second rate of change in a pitch of adjacent electrode fingers in a second region that is farther from the first IDT electrode than the first region, and within the second reflector, a third rate of change in a pitch of adjacent electrode fingers in a third region close to the fifth IDT electrode is higher than a fourth rate of change in a pitch of adjacent electrode fingers in a fourth region that is farther from the fifth IDT electrode than the third region.

3. The multimode elastic wave device of claim 1 wherein within the first reflector, a first pitch of adjacent electrode fingers varies between a maximum value and a minimum value in a first region close to the first IDT electrode and has a substantially constant value between the maximum value and the minimum value in a second region that is farther from the first IDT electrode than the first region, and within the second reflector, a second pitch of adjacent electrode fingers varies between the maximum value and the minimum value in a third region close to the fifth IDT electrode and has the substantially constant value in a fourth region that is farther from the fifth IDT electrode than the third region.

4. The multimode elastic wave device of claim 1 wherein the third average of the electrode-finger pitch in the third IDT electrode is larger than both the first average of the electrode-finger pitch in the first IDT electrode and the fifth average of the electrode-finger pitch in the fifth IDT electrode.

5. The multimode elastic wave device of claim 1 wherein a first ratio of an average of an electrode-finger pitch in the first reflector to the second average of the electrode-finger pitch in the second IDT electrode, and a second ratio of an average of an electrode-finger pitch in the second reflector to the fourth average of the electrode-finger pitch in the fourth IDT electrode range from 1.02 to 1.035 inclusive.

6. The multimode elastic wave device of claim 1 wherein each of the first reflector and the second reflector has at least three regions, electrode-finger pitches of electrode fingers in the first and second reflectors being substantially constant in each of the at least three regions, and averages of the electrode-finger pitches being different from one another in respective ones of the at least three regions.

7. The multimode elastic wave device of claim 1 wherein a pitch of electrode fingers adjacent a boundary between two adjacent ones of the first IDT electrode through the fifth IDT electrode is larger than a minimum of the electrode-finger pitch in each of the first IDT electrode through the fifth IDT electrode.

8. The multimode elastic wave device of claim 1 wherein the electrode-finger pitch in the constant-pitch region of each of the first IDT electrode, the third IDT electrode, and the fifth IDT electrode is smaller than both the electrode-finger pitch in the constant-pitch region of the second IDT electrode and the electrode-finger pitch in the constant-pitch region of the fourth IDT electrode.

9. The multimode elastic wave device of claim 1 wherein the third IDT electrode is divided into two regions at a center of the propagation direction, and comb electrodes constituting the third IDT electrode are arranged such that the two regions are 180° out of phase with each other.

10. The multimode elastic wave device of claim 1 wherein the piezoelectric substrate is made from one of lithium niobate and lithium tantalate.

11. The multimode elastic wave device of claim 1 wherein the multimode elastic wave device is a double-mode surface acoustic wave device.

12. A cascaded multimode elastic wave comprising:
a first multimode elastic wave device and a second multimode elastic wave device connected between an input terminal and a pair of output terminals, each of the first multimode elastic wave device and the second multimode elastic wave device including the multimode elastic wave device of claim 1.

13. A multimode elastic wave device comprising:
a piezoelectric substrate;
a first reflector and a second reflector disposed on the piezoelectric substrate; and
a first IDT electrode, a second IDT electrode, a third IDT electrode, a fourth IDT electrode, and a fifth IDT electrode disposed in ordinal order on the piezoelectric substrate between the first reflector and the second reflector along a propagation direction of elastic waves in the multimode elastic wave device, each of the first IDT electrode through the fifth IDT electrode, the first reflector, and the second reflector including electrode fingers and having a constant-pitch region in which an electrode-finger pitch of the electrode fingers is substantially equal, the electrode-finger pitch in the constant-pitch region of each of the first IDT electrode, the third IDT electrode, and the fifth IDT electrode being smaller than both the electrode-finger pitch in the constant-pitch region of the second IDT electrode and the electrode-finger pitch in the constant-pitch region of the fourth IDT electrode, and the electrode-finger pitch in the constant-pitch region of each of the second IDT electrode and the fourth IDT electrode being larger than both the electrode-finger pitch in the constant-pitch region of the first reflector and the electrode-finger pitch in the constant-pitch region of the second reflector, such that the multimode elastic wave device suppresses resonance in high order longitudinal modes in frequencies proximate a low frequency side of a passband of the multimode elastic wave device.

14. The multimode elastic wave device of claim 13 wherein a first ratio of an average of the electrode-finger pitch in the first reflector to an average of the electrode-finger pitch in the second IDT electrode, or a second ratio of an average of the electrode-finger pitch in the second reflector to an average of the electrode-finger pitch in the fourth IDT electrode ranges from 1.02 to 1.035 inclusive.

15. The multimode elastic wave device of claim 13 wherein the electrode-finger pitch in the first reflector varies between a maximum value and a minimum value in a first region close to the first IDT electrode and has a substantially constant value between the maximum value and the minimum value in a second region that is farther from the first IDT electrode than the first region, and the electrode-finger pitch in the second reflector varies between the maximum value and the minimum value in a third region close to the fifth IDT electrode and has the substantially constant value in a fourth region that is farther from the fifth IDT electrode than the third region.

16. The multimode elastic wave device of claim 13 wherein each of the first reflector and the second reflector has at least three regions, the electrode-finger pitches in the first and second reflectors being substantially constant in each of the at least three regions, and averages of the electrode-finger pitches being different from one another in respective ones of the at least three regions.

17. The multimode elastic wave device of claim 13 wherein a pitch of electrode fingers adjacent a boundary between two adjacent ones of the first IDT electrode through the fifth IDT electrode is larger than a minimum of the electrode-finger pitch in each of the first IDT electrode through the fifth IDT electrode.

* * * * *